US008779459B2

(12) United States Patent
Takeda et al.

(10) Patent No.: US 8,779,459 B2
(45) Date of Patent: Jul. 15, 2014

(54) LED UNIT AND ILLUMINATION DEVICE USING THE SAME

(75) Inventors: Katsuhiro Takeda, Osaka (JP); Minoru Bannai, Osaka (JP); Toyohiro Maruyama, Osaka (JP); Takasi Oosugi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/567,281

(22) Filed: Aug. 6, 2012

(65) Prior Publication Data

US 2013/0049048 A1 Feb. 28, 2013

(30) Foreign Application Priority Data

Aug. 23, 2011 (JP) ................................ 2011-181919
Aug. 23, 2011 (JP) ................................ 2011-181920
Aug. 23, 2011 (JP) ................................ 2011-181921

(51) Int. Cl.
*H01L 33/00* (2010.01)

(52) U.S. Cl.
USPC ........................ 257/99; 257/E33.056; 438/26

(58) Field of Classification Search
USPC .................................. 257/E33.056–E33.059
See application file for complete search history.

(56) References Cited

U.S. PATENT DOCUMENTS 6,924,973 B2 8/2005 Kim
7,348,604 B2 3/2008 Matheson
2004/0196636 A1 10/2004 Kim
2005/0195602 A1 9/2005 Pan
2006/0284199 A1 12/2006 Matheson
2008/0310156 A1 12/2008 Wang
2009/0272986 A1 11/2009 Chan et al.
2010/0127639 A1 5/2010 Cha
2010/0149811 A1 6/2010 Sloan et al.
2011/0044029 A1 2/2011 Konishi et al.
2011/0170293 A1 7/2011 Murai et al.
2013/0182434 A1 7/2013 He et al.

FOREIGN PATENT DOCUMENTS

JP 2007-018762 1/2007
JP 2010-251775 11/2010
JP 2011-108808 6/2011
JP 2011-124327 6/2011

(Continued)

OTHER PUBLICATIONS

Japan (JP Appl. No. 2012-252558) Office action, dated Dec. 11, 2012 along with an english translation thereof.

(Continued)

*Primary Examiner* — Daniel Whalen
(74) *Attorney, Agent, or Firm* — Greenblum & Bernstein, P.L.C.

(57) ABSTRACT

An LED unit includes a housing accommodating a wiring substrate mounted an LED, the housing including a light projecting portion for projecting light emitted from the LED, and wiring lines electrically connected to the wiring substrate. First and second lead-out portions, for leading out the wiring lines, are respectively provided at opposite end portions of the housing along a specified direction when seen in a plan view. First and second attachment portions for attaching the housing are respectively provided in the opposite end portions of the housing along the specified direction. The first and second lead-out portions are arranged at the opposite sides from each other with respect to a centerline of the housing extending along the specified direction. The first and second attachment portions are respectively arranged at the opposite sides from the first and second lead-out portions with respect to the centerline of the housing.

13 Claims, 18 Drawing Sheets

(56) References Cited

FOREIGN PATENT DOCUMENTS

| | | | | |
|---|---|---|---|---|
| JP | 2011124327 | A | * | 6/2011 |
| JP | 2011-138982 | | | 7/2011 |
| KR | 10-2004-0086659 | | | 10/2004 |
| WO | 2006/122426 | | | 11/2006 |
| WO | 2012/041638 | | | 4/2012 |

OTHER PUBLICATIONS

Japan (JP Appl. No. 2012-252559) Office action, dated Dec. 11, 2012 along with an english translation thereof.

Japan (JP Appl. No. 2012-252560) Office action, dated Dec. 11, 2011 along with an english translation thereof.

Search report from E.P.O., mail date is Mar. 19, 2014.

* cited by examiner

LED UNIT AND ILLUMINATION DEVICE USING THE SAME

FIELD OF THE INVENTION

The present invention relates to and LED unit and an illumination device using the same.

BACKGROUND OF THE INVENTION

In recent years, there is proposed a light emitting unit 62 as shown in FIG. 18 (see, e.g., Japanese Patent Application Publication No. 2011-108808). The light emitting unit 62 disclosed in JP2011-108808A includes a light emitting module 61 and a box-shaped cover member 60 covering the outside of the light emitting module 61.

The light emitting module 61 includes a light source unit 64 and a clad member 65 for covering the light source unit 64. The clad member 65 is made of a silicon resin.

The light source unit 64 includes a substantially rectangular substrate 66, a light emitting element 63 mounted on the substrate 66 and lead members 67 as lead wires.

The light emitting element 63 includes a package body 63*a* made of ceramic, an LED chip (not shown) mounted on the package body 63*a* and a light-transmitting molding resin which encapsulates the LED chip. The light emitting element 63 is supplied with electric power through the lead members 67.

The lead members 67 are soldered to the positive terminal portion, the negative terminal portion and the return wiring terminal portions formed in the wiring pattern on the substrate 66. The lead members 67 are led out from the opposite sides of the substrate 66.

The clad member 65 is formed into a rectangular parallelepiped shape and is provided with protrusion portions 65*a* from which the lead members 67 are led out.

The cover member 60 has an opening formed at one surface side thereof (at the rear side of the drawing sheet in FIG. 18). Notch portions (not shown) each having a generally U-like shape are formed in the opposing side walls existing at the opening side of the cover member 60. The protrusion portions 65*a* of the clad member 65, from which the lead members 67 are led out, are fitted to the notch portions.

Attachment tongue pieces 60*b* extending outward are formed on a diagonal line at the opening side of the opposing side walls having the notch portions. The cover member 60 is in the form of 180 degree rotation symmetry. Screw holes, through which attachment screws are inserted, are formed in the attachment tongue pieces 60*b*.

There is also proposed a light emitting unit as shown in FIG. 19 (see, e.g., Japanese Patent Application Publication No. 2011-124327). The light emitting unit disclosed in JP2011-124327A includes a light emitting module 261 and a box-shaped case 270 covering the outside of the light emitting module 261.

The light emitting module 261 includes a light source unit 264 and a frame-like seal member 269 made of a silicon resin and arranged to surround the outer periphery of the light source unit 264.

The light source unit 264 includes a substantially rectangular substrate 266, a light emitting element 263 mounted on the substrate 266 and lead members 267 as lead wires. The light emitting element 263 includes a package body (not shown) made of ceramic, an LED chip (not shown) mounted on the package body and a light-transmitting molding resin which encapsulates the LED chip.

The seal member 269, which has a rectangular frame shape, is formed larger than the outer periphery of the substrate 266. A pair of protrusion portions 269*a*, from which the lead members 267 are led out, is formed in the two opposing sides of the seal member 269.

The case 270 includes a box-shaped base case member 271 having an opening 271*a* and a box-shaped cover case member 272 having an opening 272*a*. In this light emitting unit, the seal member 269 is interposed between, and gripped by, the end portion of the base case member 271 existing at the side of the opening 271*a* and the end portion of the cover case member 272 existing at the side of the opening 272*a*.

The base case member 271 includes an attachment piece 271*b* having a screw hole through which an attachment screw 268 is inserted.

The cover case member 272 is made of a transparent acryl resin so that the light emitted from the light emitting element 263 can transmit the cover case member 272. A convex portion 272*c* protruding in a dome-like shape is formed in the portion of the cover case member 272 opposing the light emitting element 263. In the cover case member 272, an attachment tongue piece 272*b* having a screw hole through which an attachment screw 268 is inserted is formed in a position corresponding to the attachment piece 271*b* of the base case member 271. The height of the cover case member 272 is set a little larger than the height of the base case member 271.

In the light emitting unit 62 disclosed in JP2011-108808A, the protrusion portions 65*a* are formed in the opening-side central areas of the opposing side walls of the cover member 60. The attachment tongue pieces 60*b* are arranged at the opposite sides from each other with respect to the centerline interconnecting the protrusion portions 65*a* of the cover member 60 when seen in a plan view. Therefore, it is difficult to reduce the size of the light emitting unit 62 in the transverse direction orthogonal to the centerline when seen in a plan view.

In the light emitting unit 62 shown in FIG. 18, there are four lead members 67 respectively connected to the positive terminal portion, the negative terminal portion and the return wiring terminal portions formed in the wiring pattern on the substrate 66. Electric power is supplied to the light emitting element 63 through the lead members 63. It is therefore likely that a power loss may be generated in the light emitting unit 62 due to the voltage drop caused by the wiring pattern between the return wiring terminal portions on the substrate 66.

In the light emitting unit of the configuration shown in FIG. 19, the convex portion 272*c* protruding in a dome-like shape is formed in the portion of the cover case member 272 opposing the light emitting element 263. The convex portion 272*c* serves as a lens portion. This makes it possible to efficiently extract the light emitted by the light emitting element 263 from the case 270.

In the light emitting unit of the configuration shown in FIG. 19, however, a demand exists to further enhance the light utilization efficiency.

SUMMARY OF THE INVENTION

In view of the above, the present invention provides an LED unit capable of enjoying size reduction and an illumination device using the same.

Further, the present invention provides an LED unit capable of reducing a power loss and an illumination device using the same.

The present invention provides an LED unit capable of increasing light utilization efficiency and an illumination device using the same.

In accordance with an aspect of the present invention, there is provided an LED unit including: a wiring substrate mounted with an LED; a box-shaped housing which accommodates the wiring substrate, the housing including a light projecting portion for projecting light emitted from the LED; and at least one pair of wiring lines electrically connected to the wiring substrate and led out from the housing, wherein a first lead-out portion, for leading out one of the wiring lines, is provided at one end portion of the housing along a specified direction when seen in a plan view, a second lead-out portion, for leading out the other wiring line, is provided at the other end portion of the housing along the specified direction, and a first attachment portion and a second attachment portion for attaching the housing are respectively provided in the one end portion and the other end portion of the housing along the specified direction. The first lead-out portion and the second lead-out portion are arranged at the opposite sides from each other with respect to a centerline of the housing extending along the specified direction when seen in a plan view. The first attachment portion and the second attachment portion are respectively arranged at the opposite sides from the first lead-out portion and the second lead-out portion with respect to the centerline of the housing.

The housing may include a first housing member arranged at an LED mounting side of the wiring substrate and provided with the light projecting portion and a second housing member arranged at the opposite side of the wiring substrate from the LED mounting side, the light projecting portion being a lens portion for controlling distribution of the light emitted from the LED, the light projecting portion having a light projecting surface formed into a convex shape, each of the wiring lines being a cable including a conductor electrically connectable to the wiring substrate and an insulating cover portion covering the conductor, a portion of the conductor being exposed within the housing, the first housing member including a slant portion formed such that the distance between the first housing member and the second housing member grows smaller toward the lens portion, the portion of the conductor of each of the wiring lines being arranged between the slant portion of the first housing member and the second housing member and being electrically connected to the wiring substrate by a solder.

The first housing member and the second housing member may be made of a resin material, the housing being formed by welding the first housing member and the second housing member together, a sealing material being filled into the first lead-out portion and the second lead-out portion.

The portion may include a first tension reducer for gripping a portion of one of the wiring lines in cooperation with an inner wall of the first lead-out portion and wherein the second lead-out portion includes a second tension reducer for gripping a portion of the other wiring line in cooperation with an inner wall of the second lead-out portion.

The LED unit may further include an electric wire electrically insulated from the wiring lines and the wiring substrate within the housing and led out through the first lead-out portion and the second lead-out portion.

In accordance with another aspect of the present invention, there is provided an LED unit including: a wiring substrate mounted with an LED; a housing which accommodates the wiring substrate, the housing including a light projecting portion for projecting light emitted from the LED; and at least one pair of wiring lines electrically connected to the wiring substrate and led out from the housing. The housing includes a first housing member arranged at an LED mounting side of the wiring substrate and provided with the light projecting portion and a second housing member arranged at the opposite side of the wiring substrate from the LED mounting side. The light projecting portion is a lens portion for controlling distribution of the light emitted from the LED, the light projecting portion having a light projecting surface formed into a convex shape. Each of the wiring lines is a cable including a conductor and an insulating cover portion covering the conductor, a portion of the conductor being exposed within the housing. The first housing member includes a slant portion formed such that the distance between the opposite surface of the first housing member from the second housing member and the second housing member grows smaller toward the lens portion. The portion of the conductor of each of the wiring lines is arranged between the slant portion of the first housing member and the second housing member and is electrically connected to the wiring substrate by a solder.

When an optical axis of the LED is aligned with an optical axis of the lens portion, an inclination angle of a slant surface of the slant portion opposite to the second housing member with respect to the optical axis of the lens portion may be set equal to or larger than a maximum projecting angle at which the light projected from the light projecting surface of the lens portion makes a greatest angle with respect to the optical axis of the lens portion.

In accordance with still another aspect of the present invention, there is provided an LED unit including: a wiring substrate mounted with an LED; a housing which accommodates the wiring substrate, the housing including a light projecting portion for projecting light emitted from the LED; a pair of wiring lines electrically connected to the wiring substrate and led out from the housing, the wiring lines being electrically connected to an anode electrode and a cathode electrode of the LED, respectively; and an electric wire electrically insulated from the wiring lines and the wiring substrate within the housing and led out from the housing.

A reception groove for receiving a portion of the electric wire may be formed on an inner surface of the housing in an area outward of the light projecting portion.

A tension reducer for gripping a portion of the electric wire may be provided within the housing.

In accordance with still another aspect of the present invention, there is provided an illumination device including: any one of the LED units described above; a power supply unit for supplying electric power to the LED unit; and a device body which holds the LED unit and the power supply unit.

According to the aspects of the present invention, it is possible to provide an LED unit capable of enjoying size reduction and an illumination device provided with the same.

Further, it is possible to provide an LED unit capable of increasing light utilization efficiency and an illumination device provided with the same.

Moreover, it is possible to provide an LED unit capable of reducing a power loss and an illumination device provided with the same.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

Figure 1A:
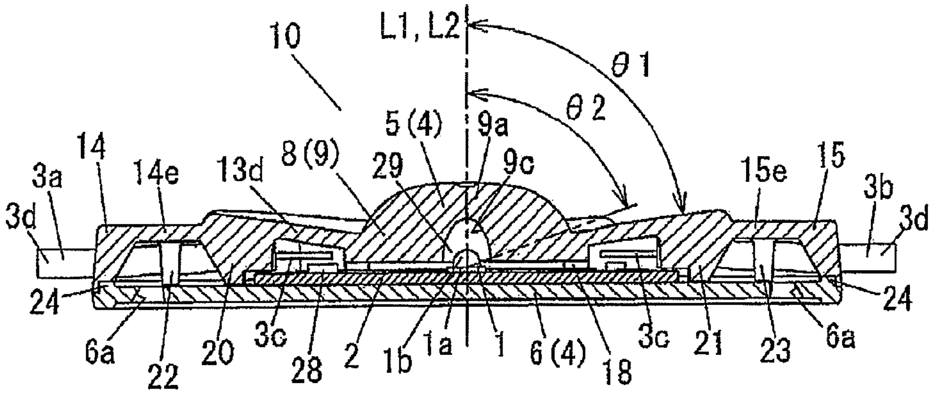
FIG. 1A is a section view showing an LED unit according to one embodiment of the present invention and FIG. 1B is a front view of the LED unit.
Figure 1B:
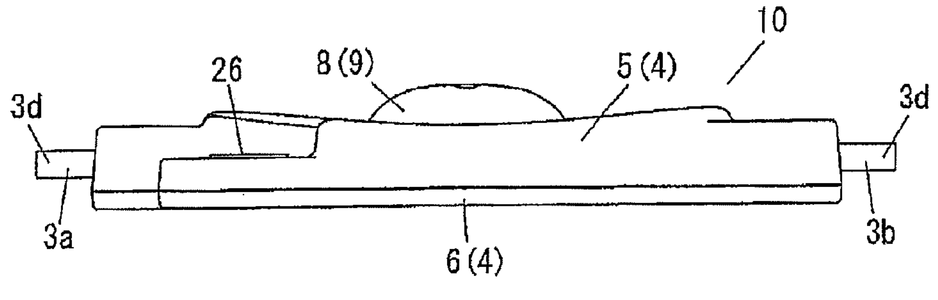
Figure 2:
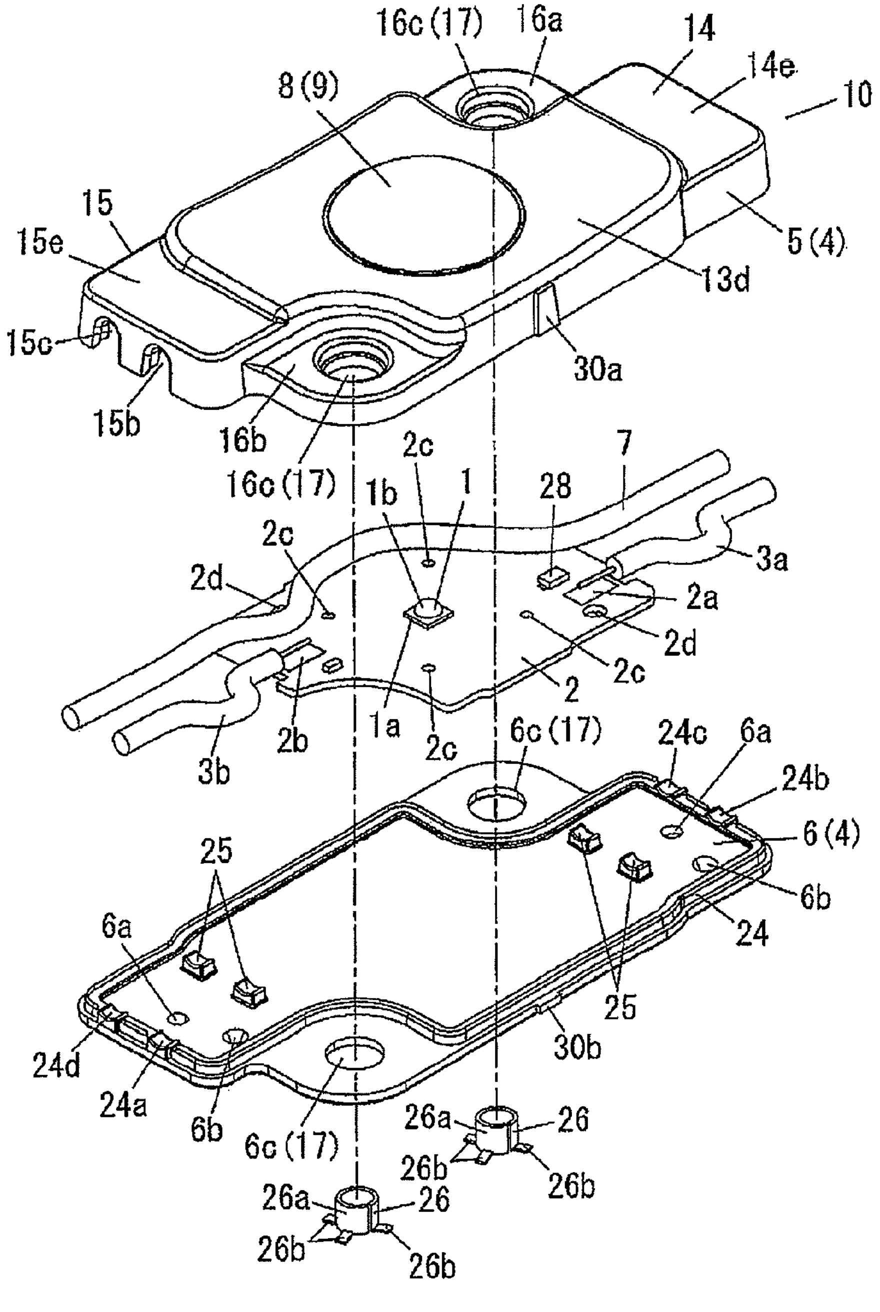
FIG. 2 is a schematic exploded perspective view of the LED unit.
Figure 3A:
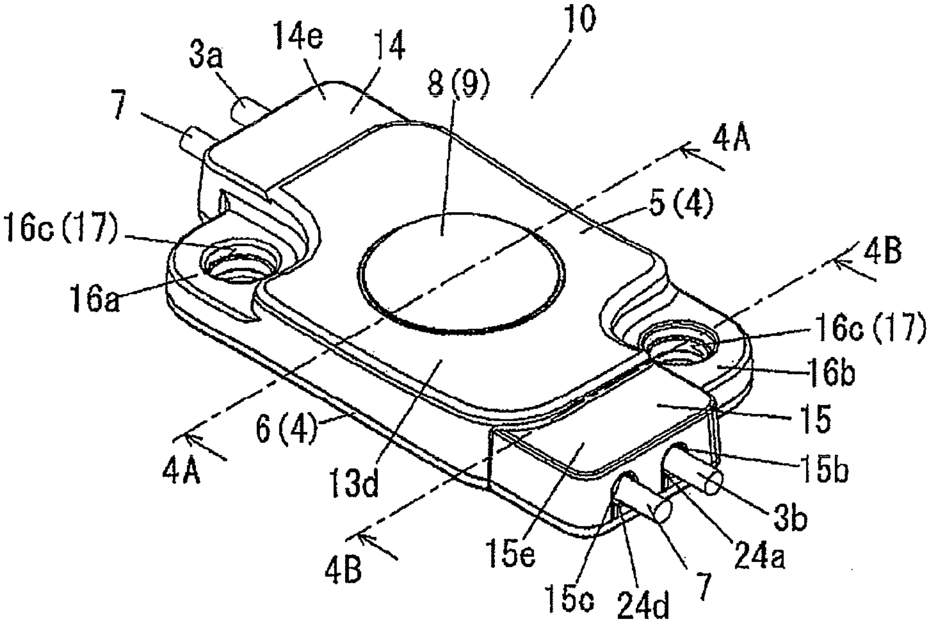
FIG. 3A is a top perspective view of the LED unit and FIG. 3B is a bottom perspective view of the LED unit.
Figure 3B:
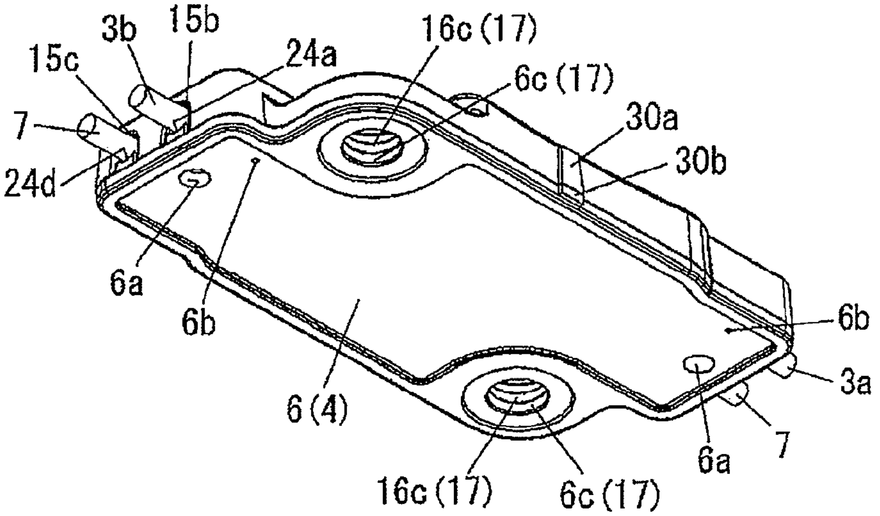
Figure 4A:
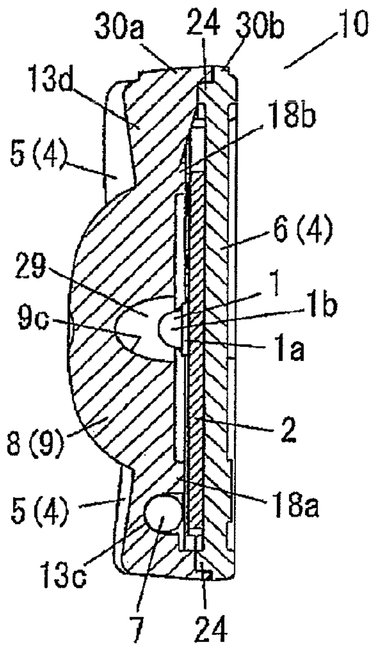
FIG. 4A is a section view of the LED unit taken along line 4A-4A in FIG. 3A.
Figure 4B:
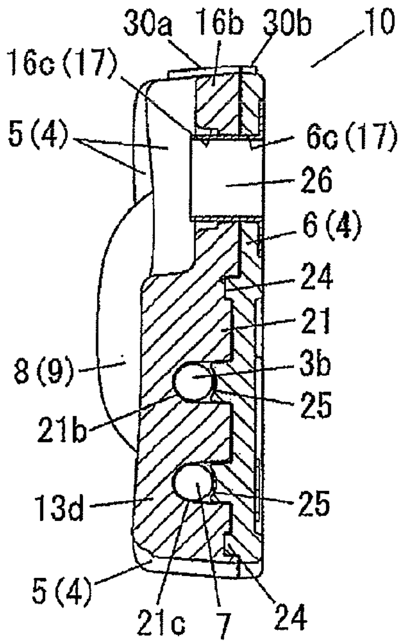
FIG. 4B is a section view of the LED unit taken along line 4B-4B in FIG. 3A.
Figure 4C:
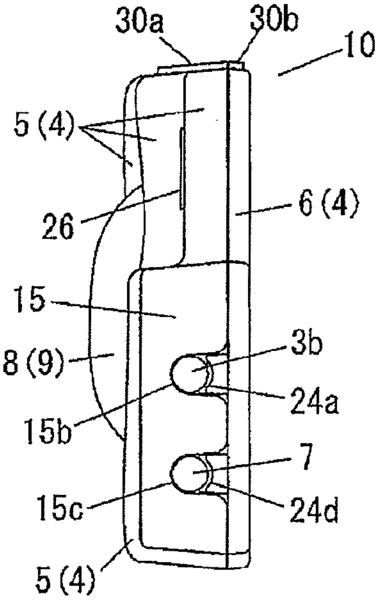
FIG. 4C is a side view of the LED unit.
Figure 5A:
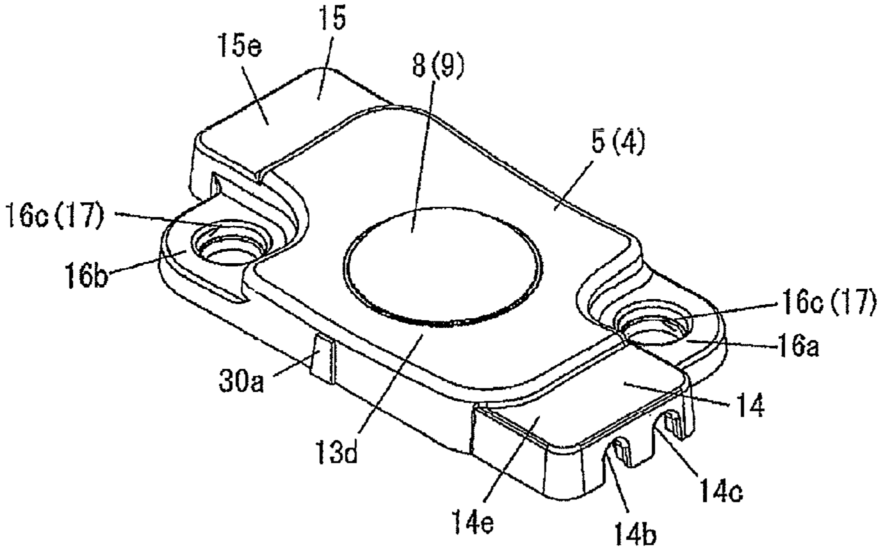
FIG. 5A is a top perspective view showing a first housing member of the LED unit and FIG. 5B is a bottom perspective view of the first housing member.
Figure 5B:
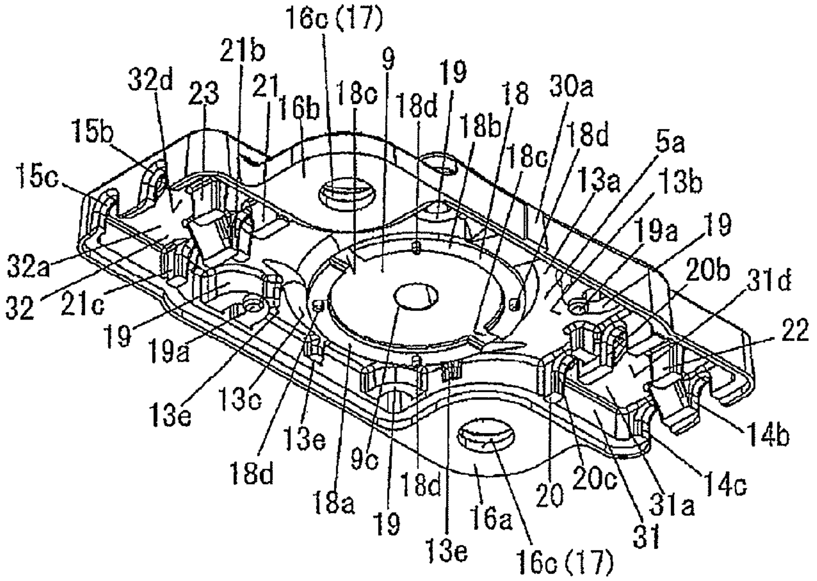
Figure 6A:
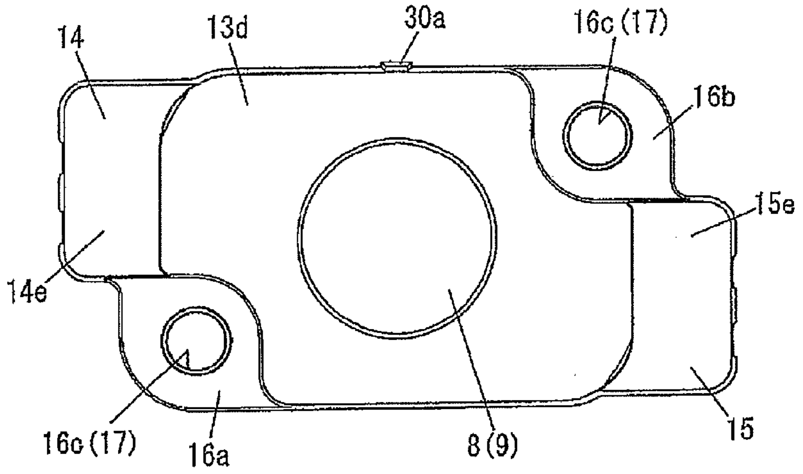
FIG. 6A is a top view of the first housing member of the LED unit and FIG. 6B is a bottom view of the first housing member.
Figure 6B:
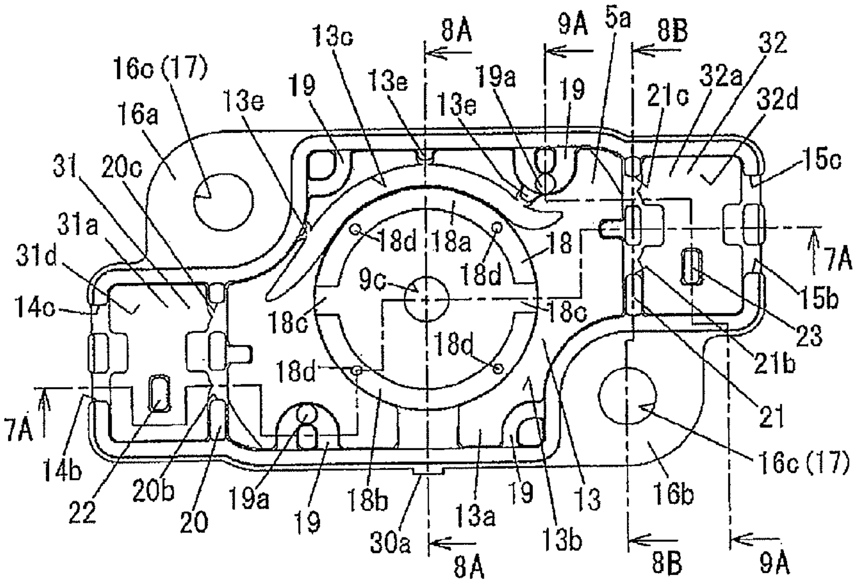
Figure 7A:
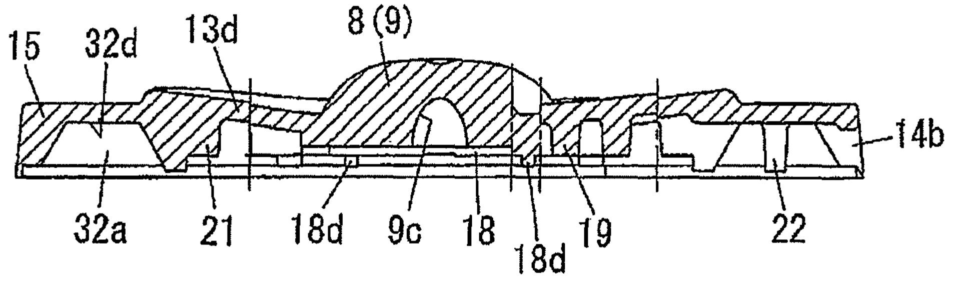
FIG. 7A is a section view of the first housing member of the LED unit taken along line 7A-7A in FIG. 6B.
Figure 7B:
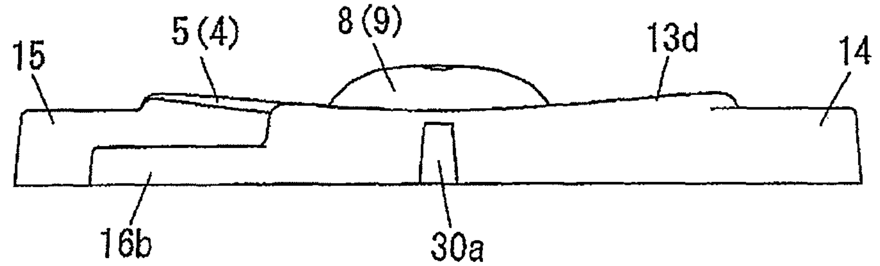
FIG. 7B is a front view of the first housing member.
Figure 8A:
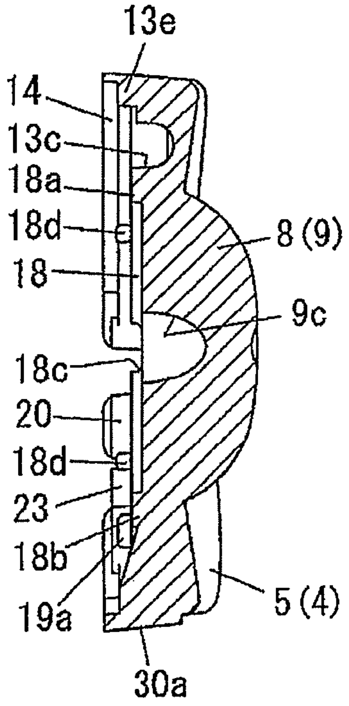
FIG. 8A is a section view of the first housing member of the LED unit taken along line 8A-8A in FIG. 6B.
Figure 8B:
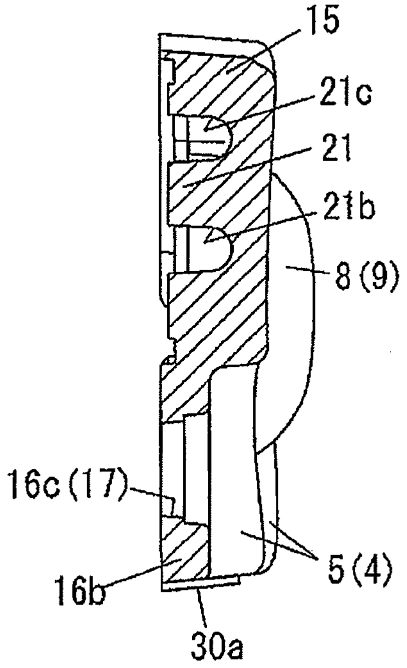
FIG. 8B is a section view of the first housing member of the LED unit taken along line 8B-8B in FIG. 6B.
Figure 9A:
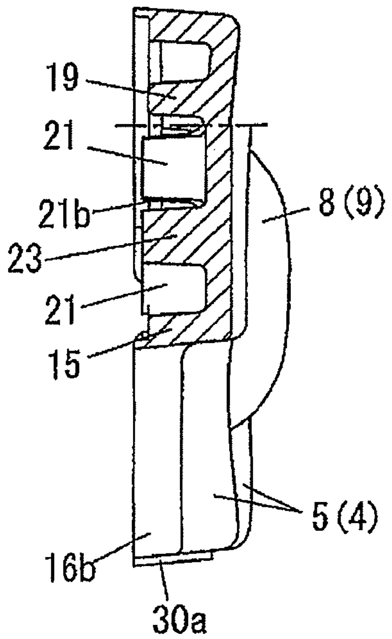
FIG. 9A is a section view of the first housing member of the LED unit taken along line 9A-9A in FIG. 6B.
Figure 9B:
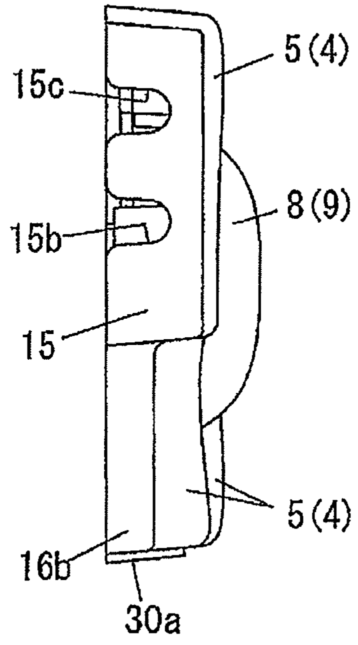
FIG. 9B is a side view of the first housing member.
Figure 10A:
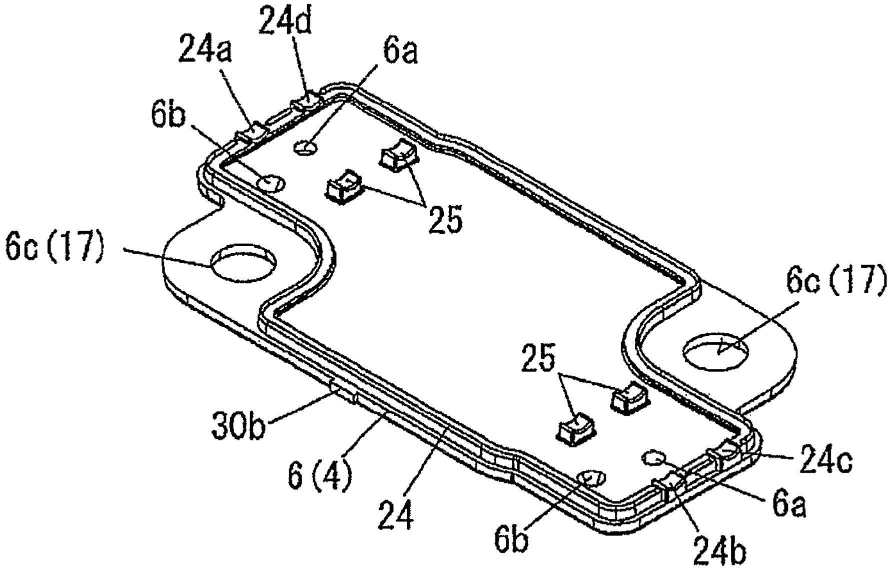
FIG. 10A is a top perspective view showing a second housing member of the LED unit and FIG. 10B is a bottom perspective view of the second housing member.
Figure 10B:
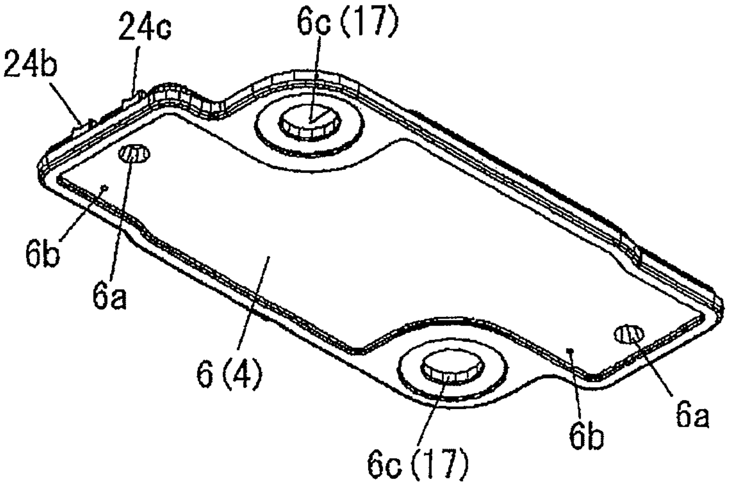
Figure 11A:
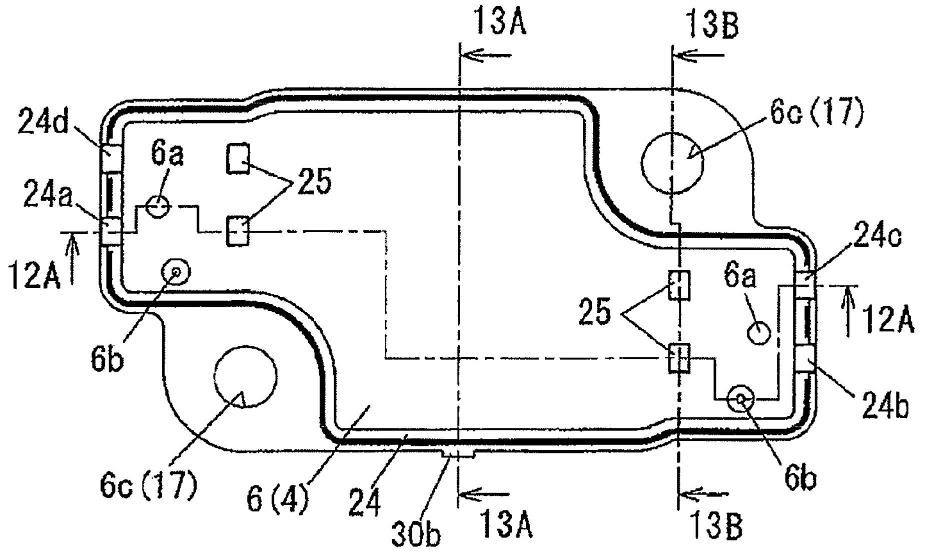
FIG. 11A is a top view of the second housing member of the LED unit and FIG. 11B is a bottom view of the second housing member.
Figure 11B:
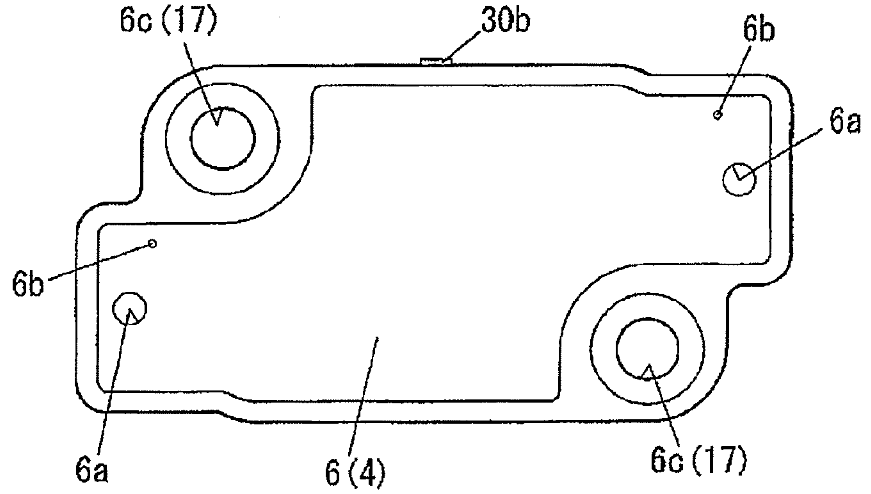
Figure 12A:
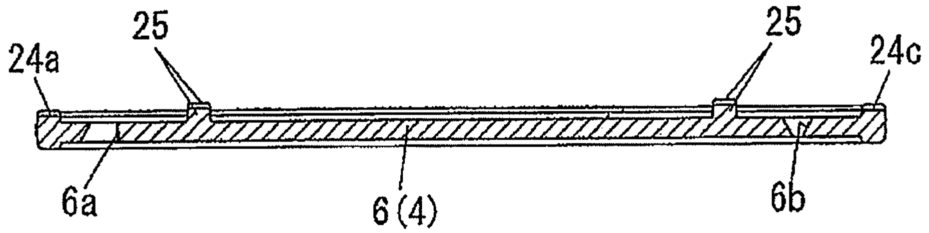
FIG. 12A is a section view of the second housing member of the LED unit taken along line 12A-12A in FIG. 11A.
Figure 12B:
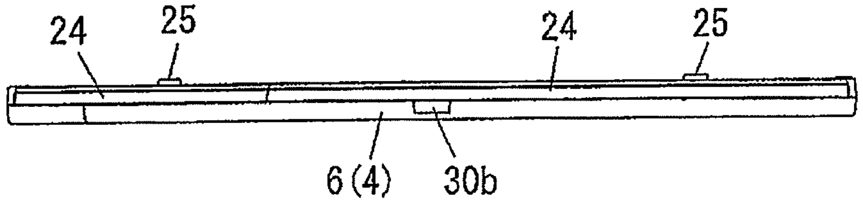
FIG. 12B is a front view of the second housing member.
Figure 13A:
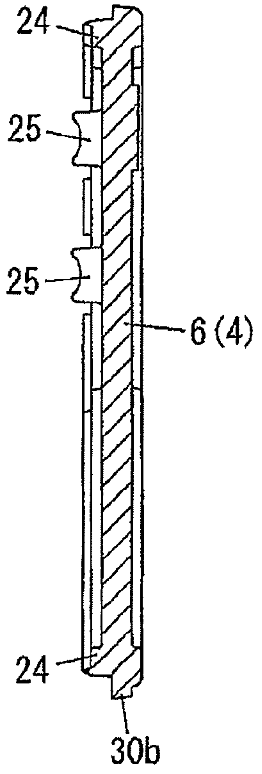
FIG. 13A is a section view of the second housing member of the LED unit taken along line 13A-13A in FIG. 11A.
Figure 13B:
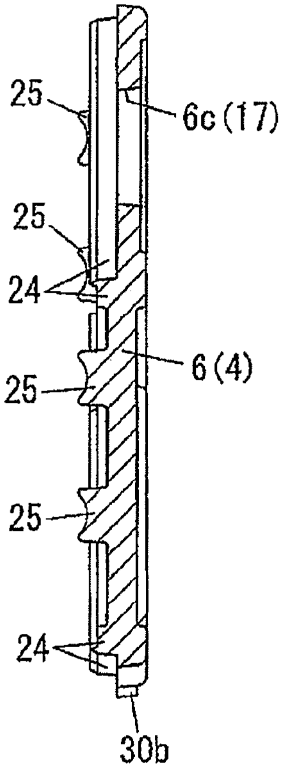
FIG. 13B is a section view of the second housing member taken along line 13B-13B in FIG. 11A.
Figure 13C:
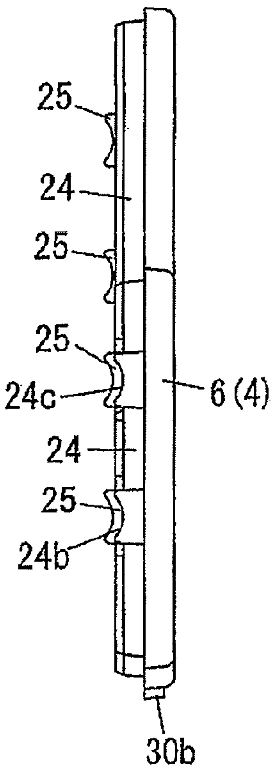
FIG. 13C is a side view of the second housing member.
Figure 14A:
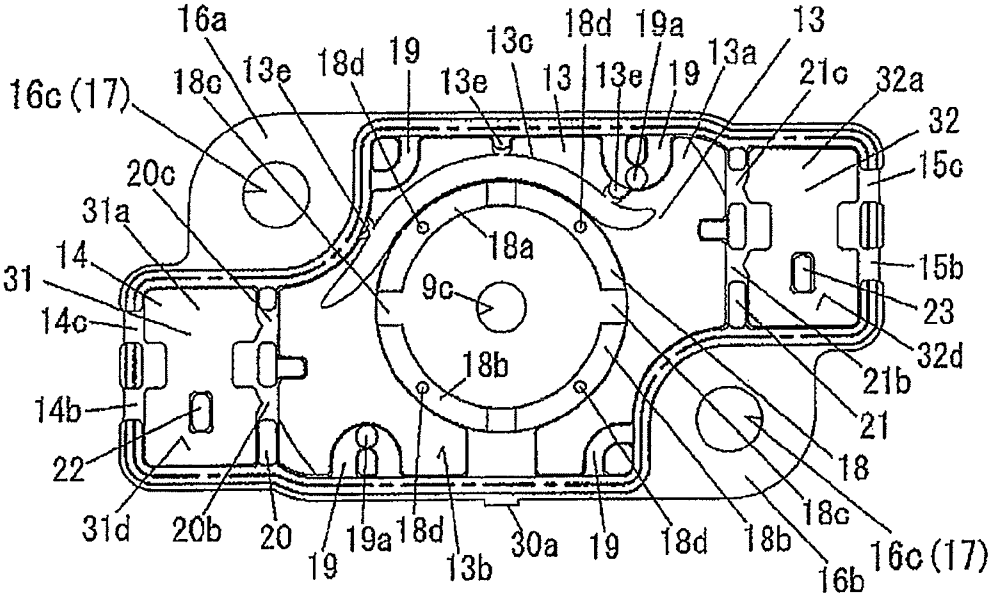
FIG. 14A is an explanatory view showing the portion of the first housing member of the LED unit welded to the second housing member and FIG. 14B is an explanatory view explaining the flow path of a sealing material.
Figure 14B:
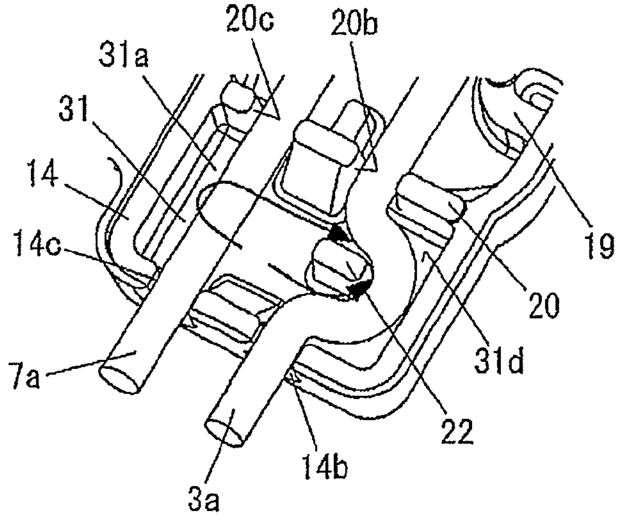

Embodiments of the present invention will now be described in detail with reference to the accompanying drawings which form a part hereof. Throughout the drawings, identical or similar portions will be designated by like reference symbols and redundant description thereof will be omitted.

An LED unit according to an embodiment of the present invention will now be described with reference to FIGS. 1A through 17

The LED unit 10 of the present embodiment is used as, e.g., a light source of an illumination device. The LED unit 10 includes a wiring substrate 2 mounted with an LED 1, a housing 4 arranged to accommodate the wiring substrate 2 and provided with a light projecting portion 8 through which the light emitted from the LED 1 is projected, and a pair of wiring lines 3*a* and 3*b* electrically connected to the wiring substrate 2 and led out from the housing 4. In the present embodiment, the housing 4 is formed into a box-like shape.

As the LED 1, it is possible to use a white LED that generates white light through the combination of an LED chip for emitting blue light (hereinafter referred to as "blue LED chip") and a fluorescent body made of a yellow fluorescent material which is excited by the blue light emitted from the blue LED chip to emit broad yellow light. The LED 1 includes, e.g., a blue LED chip (not shown), a mounting substrate 1*a* mounted with the blue LED chip, a color converting portion (not shown) arranged to cover the blue LED chip and made of a first light-transmitting material (e.g., a silicon resin, an epoxy resin or a glass) containing a yellow fluorescent material, and an encapsulating portion 1*b* arranged to encapsulate the blue LED chip and the color converting portion and made of a second light-transmitting material (e.g., a silicon resin, an epoxy resin or a glass). The fluorescent material of the LED 1 is not limited to the yellow fluorescent material but may be, e.g., a red fluorescent material or a green fluorescent material. The LED 1 may be a white LED that generates white light through the combination of an LED chip for emitting violet-to-near violet rays and a red fluorescent material, a green fluorescent material or a blue fluorescent material. The LED 1 may be a white LED that generates white light through the combination of an LED chip for emitting red light, an LED chip for emitting green light and an LED chip for emitting blue light. The color of the light emitted from the LED 1 is not limited to white.

The wiring substrate 2 is, e.g., a printed wiring substrate manufactured by forming an appropriate conductor pattern (not shown) on an insulating base made of a glass epoxy resin. In the wiring substrate 2, a pair of terminal portions 2*a* and 2*b* electrically connectable to the LED 1 is formed by certain portions of the conductor pattern. In the present embodiment, an anode electrode of the LED 1 is connected to the terminal portion 2*a* and a cathode electrode of the LED 1 is connected to the terminal portion 2*b*. While the printed wiring substrate is used as the wiring substrate 2 in the present embodiment, the present invention is not limited thereto. For example, a metal-based printed wiring substrate or a ceramic substrate may be used as the wiring substrate 2. On one surface (the upper surface in FIG. 1A) of the wiring substrate 2 on which the LED 1 is mounted, symbols "+" and "−" indicating the polarities of the terminal portions 2*a* and 2*b* are marked near the terminal portions 2*a* and 2*b*.

In the present embodiment, a Zener diode 28 for preventing dielectric breakdown of the LED 1 is electrically connected between the terminal portions 2*a* and 2*b* of the wiring substrate 2. The Zener diode 28 is mounted on one surface of the wiring substrate 2 on which the LED 1 is mounted.

On the surface of the wiring substrate 2 on which the LED 1 is mounted, there is formed a reflection layer (not shown) such as a white resist layer or the like covering most of other areas than the LED 1 and the terminal portions 2*a* and 2*b*. In the present embodiment, it is therefore possible to restrain the light emitted by the LED 1 from being absorbed to the wiring substrate 2.

A pair of wiring lines 3*a* and 3*b* is electrically connected to the terminal portions 2*a* and 2*b* of the wiring substrate 2 through junction portions (not shown) made of a solder. In the present embodiment, the wiring line 3*a* is electrically connected to the terminal portion 2*a* and the wiring line 3*b* is electrically connected to the terminal portion 2*b*. Briefly, in the present embodiment, the wiring line 3*a* is electrically connected to the anode electrode of the LED 1 and the wiring line 3*b* is electrically connected to the cathode electrode of the LED 1. Each of the wiring lines 3*a* and 3*b* employed in the present embodiment is a cable including a conductor 3*c* electrically connectable to the wiring substrate 2 and an insulating cover portion 3*d* covering the conductor 3*c*. The conductor 3*c* is partially exposed within the housing 4.

In the LED unit 10 of the present embodiment, there is provided a single electric wire 7 electrically insulated from the wiring lines 3*a* and 3*b* and the wiring substrate 2 within the housing 4 and led out from the housing 4. In the present embodiment, as an example, one end of the electric wire 7 is electrically connected to a power supply unit 11 (see FIGS. 16A to 17) and the other end of the electric wire 7 is electrically connected to the wiring line 3*b* of the LED unit 10. In the LED unit 10 of the present embodiment, the electric wire 7 is provided independently of the wiring substrate 2. Therefore, as compared with a case where a conductor pattern serving as a return line is formed on the wiring substrate 2, it is possible to reduce a power loss in the LED unit 10 caused by the wiring substrate 2.

One end and the other end of the electric wire 7 can be electrically connected to the other end and one end of an electric wire 7 of another LED unit 10, respectively.

The housing 4 includes a first housing member 5 provided with the light projecting portion 8 and arranged on the side of the wiring substrate 2 on which the LED 1 is mounted and a plate-like second housing member 6 arranged on the opposite side of the wiring substrate 2 from the side on which the LED 1 is mounted (on the lower side in FIG. 1A). In the present embodiment, the first housing member 5 and the second housing member 6 are made of, e.g., an acryl resin (such as a polymethyl methacrylate resin or the like).

The first housing member 5 is formed into a box-like shape to have an opening 5*a* (see FIGS. 5A to 6B) formed at the side of the wiring substrate 2 (at the lower side in FIG. 1A). A first lead-out portion 14 for leading out the wiring line 3*a* therethrough is provided in one end portion (the left end portion in FIGS. 6A and 6B) of the first housing member 5 in a specified direction (in the left-right direction in FIGS. 6A and 6B) when the housing 4 is seen in a plan view. A second lead-out portion 15 for leading out the wiring line 3*b* therethrough is provided in the other end portion (the right end portion in FIGS. 6A and 6B) of the first housing member 5 in the specified direction when the housing 4 is seen in a plan view. Briefly, when the housing 4 is seen in a plan view, the first lead-out portion 14 for leading out the wiring line 3*a* therethrough is provided in one end portion of the first housing member 5 in the specified direction and the second lead-out portion 15 for leading out the wiring line 3*b* therethrough is provided in the other end portion of the first housing member 5 in the specified direction. In this regard, one end portion of the electric wire 7 is led out through the first lead-out portion 14 and the other end portion of the electric wire 7 is led out through the second lead-out portion 15.

The first housing member 5 includes a first storage compartment 13 having an opening 13*a* at the side of the wiring substrate 2. The first storage compartment 13 stores the wiring substrate 2 mounted with the LED 1.

The light projecting portion 8 is formed in the central region of a bottom portion 13*b* of the first storage compartment 13 in a corresponding relationship with the LED mounted on the wiring substrate 2. In the present embodiment, the light projecting portion 8 serves as a lens portion 9 for controlling distribution of the light emitted from the LED 1. The light projecting surface of the light projecting portion 8 is formed into a convex shape. A concave portion 9*a* is formed in the central region of the light projecting surface of the lens portion 9. In the present embodiment, it is therefore possible to widen the distribution of the light projected from the light projecting surface of the lens portion 9.

A recess 9*c* for receiving a portion of the LED 1 is provided in the central region of the surface of the lens portion 9 opposing the wiring substrate 2. In the present embodiment, a space 29 exists between the light emitting surface of the LED 1 and the inner surface of the recess 9*c* of the lens portion 9. In the present embodiment, the light emitting surface of the LED 1 is formed into a hemispherical shape and the recess 9*c* of the lens portion 9 is formed into a semi-elliptical sphere shape. In the present embodiment, therefore, the light emitted from the light emitting surface of the LED 1 can be incident on the whole inner surface of the recess 9*c* of the lens portion 9. This makes it possible to increase the light utilization efficiency.

In the periphery of the surface of the lens portion 9 opposing the wiring substrate 2, a cylindrical peripheral wall 18 making contact with the wiring substrate 2 is formed to protrude toward the wiring substrate 2. Grooves 18*c* for dissipating the heat radiated from the LED 1 are formed at multiple points (at two points in the illustrated example) in the peripheral wall 18. In the present embodiment, the peripheral wall 18 includes a first peripheral wall 18*a* having a semicircular shape in a plan view and a second peripheral wall 18*b* having a semicircular shape in a plan view.

On the area of each of the first peripheral wall 18*a* and the second peripheral wall 18*b* opposing the wiring substrate 2, there is provided a plurality of (two, in the illustrated example) first lugs 18*d* for positioning the first housing member 5 on the wiring substrate 2. On the areas of the wiring substrate 2 opposing the first lugs 18*d* of the peripheral wall 18 of the lens portion 9, there are formed first reception holes 2*c* for receiving the first lugs 18*d*, respectively.

On the area of the bottom portion 13*b* of the first storage compartment 13 opposing the wiring substrate 2, first ribs 19 capable of making contact with the wiring substrate 2 are provided at multiple points (at four points in the illustrated example). In the present embodiment, second lugs 19*a* for positioning the first housing member 5 on the wiring substrate 2 are formed in two of the four first ribs 19. On the areas of the wiring substrate 2 opposing the second lugs 19*a* of the two first ribs 19 of the first storage compartment 13, there are formed second reception holes 2*d* for receiving the second lugs 19*a*, respectively.

On the area other than the lens portion 9 of the bottom portion 13*b* of the first storage compartment 13 opposing the wiring substrate 2, a reception groove 13*c* for receiving a portion of the electric wire 7 is formed to extend along the first peripheral wall 18*a* of the lens portion 9. Briefly, in the present embodiment, the reception groove 13*c* for receiving a portion of the electric wire 7 is formed on the area of the inner surface of the housing 4 outward of the light projecting portion 8. In the present embodiment, it is therefore possible to prevent the electric wire 7 from being partially interposed between the light projecting portion 8 and the wiring substrate 2. In the present embodiment, the electric wire 7 is partially received in the reception groove 13*c*. It is therefore possible to reduce the height of the housing 4 in the thickness direction of the wiring substrate 2 and to lower the profile of the LED unit 10.

In the present embodiment, projections 13*e* for gripping the electric wire 7 partially received in the reception groove 13*c* in cooperation with the first peripheral wall 18*a* are formed at multiple points (at two points in the illustrated example) on the inner side surface of the first storage compartment 13. In the present embodiment, another projection 13*e* is formed in one of the four first ribs 19 of the first storage compartment 13. Accordingly, the projections 13*e* for gripping the electric wire 7 partially received in the reception groove 13*c* of the first storage compartment 13 in cooperation with the first peripheral wall 18*a* are formed at three points. Briefly, in the present embodiment, the projections 13*e* of the first storage compartment 13 and the first peripheral wall 18*a* of the first housing member 5 serve as a tension reducer for reducing the tension applied to the electric wire 7 partially received in the reception groove 13*c*. In other words, the tension reducer for gripping a portion of the electric wire 7 is provided within the housing 4. In the present embodiment, therefore, it is not necessary to employ an additional component for reducing the tension applied to the electric wire 7. This makes it possible to realize a function of reducing the tension of the electric wire 7 in a cost-effective manner.

A slant portion 13*d* formed such that the distance between the first housing member 5 and the second housing member 6 grows smaller toward the lens portion 9 is provided on the area of the bottom portion 13*b* of the first storage compartment 13 other than the lens portion 9. The slant portion 13*d* is formed such that the distance between the opposite surface of the first housing member 5 from the second housing member 6 (the upper surface of the first housing member 5 in FIG. 5A) and the second housing member 6 grows smaller toward the lens portion 9. In the present embodiment, it is therefore possible to increase the area of the light projecting surface (lens surface) of the lens portion 9 and to increase the light utilization efficiency. Further, in the present embodiment, the first housing member includes the slant portion 13*d* formed such that the distance between the opposite surface of the first housing member 5 from the second housing member 6 and the second housing member 6 grows smaller toward the lens portion 9.

In the present embodiment, it is preferred that, when the optical axis L1 of the LED 1 is aligned with the optical axis L2 of the lens portion 9, the inclination angle θ1 of the slant surface of the slant portion 13*d* opposite to the second housing member 6 with respect to the optical axis L2 of the lens portion 9 be set equal to or larger than the maximum projecting angle θ2 at which the light projected from the light projecting surface of the lens portion 9 makes the greatest angle with respect to the optical axis L2 of the lens portion 9. In the present embodiment, it is therefore possible to restrain the light projected from the light projecting surface of the lens portion 9 from being reflected by the slant surface of the slant portion 13*d*. In the present embodiment, it is also possible to widen the distribution of the light projected from the light projecting surface of the lens portion 9 because the light projected from the light projecting surface of the lens portion 9 can be restrained from being reflected by the slant surface of the slant portion 13*d*. In FIG. 1A, the maximum projecting angle θ2 is set equal to 82 degrees and the inclination angle θ1 is set equal to 83 degrees. However, the present invention is not limited thereto. For example, the maximum projecting angle θ2 and the inclination angle θ1 may be set equal to 82 degrees. In the present embodiment, it is preferred that the inclination angle θ1 of the slant portion 13*d* be set smaller than 90 degrees.

In the present embodiment, a portion of the conductor 3*c* of the wiring line 3*a* is arranged between the slant portion 13*d* of the first housing member 5 and the second housing member 6 and is electrically connected to the terminal portion 2*a* of the wiring substrate 2. In the present embodiment, a portion of the conductor 3*c* of the wiring line 3*b* is arranged between the slant portion 13*d* of the first housing member 5 and the second housing member 6 and is electrically connected to the terminal portion 2*b* of the wiring substrate 2. In this regard, the portions of the conductors 3*c* of the wiring lines 3*a* and 3*b* are electrically connected to the terminal portions 2*a* and 2*b* through the junction portions stated above.

Briefly, in the present embodiment, the portions of the conductors 3*c* of the wiring lines 3*a* and 3*b* are arranged between the slant portion 13*d* of the first housing member 5 and the second housing member 6 and are electrically connected to the respective terminal portions 2*a* and 2*b* of the wiring substrate 2 by solders. In the present embodiment, therefore, the distance between the slant portion 13*d* of the first housing member 5 and the second housing member 6 can be set smaller than the outer diameter of each of the wiring lines 3*a* and 3*b* including the insulating cover portions 3*d* thereof and can be reduced to become equal to the height of the swelling junction portions made of the solders electrically interconnecting the portions of the conductors 3*c* of the wiring lines 3*a* and 3*b* and the terminal portions 2*a* and 2*b*. Therefore, as compared with a case where the slant portion 13*d* is not formed in the first housing member 5, it is possible to reduce the height of the housing 4 in the thickness direction of the wiring substrate 2 and to lower the profile of the LED unit 10.

In the first lead-out portion 14, there is formed a second storage compartment 31 (see FIGS. 5B and 6B) having an opening 31*a* at the side of the wiring substrate 2. The second storage compartment 31 stores portions of the wiring line 3*a* and the electric wire 7. The second storage compartment 31 is isolated from the first storage compartment 13 by a first partition wall portion 20. A first insertion hole 20*b*, through which the wiring line 3*a* is inserted, is formed in the first partition wall portion 20. In addition, a second insertion hole 20*c*, through which the electric wire 7 is inserted, is formed in the first partition wall portion 20. In this regard, the second storage compartment 31 communicates with the first storage compartment 13 through the first insertion hole 20*b* and the second insertion hole 20*c* formed in the first partition wall portion 20.

The bottom portion 31*d* of the second storage compartment 31 makes up a first flat portion 14*e* formed such that the distance between the first housing member 5 and the second housing member 6 remains constant away from the slant portion 13*d* of the first housing member 5. In the present embodiment, the distance between the first flat portion 14*e* of the second storage compartment 31 and the second housing member 6 is set a little larger than the outer diameter of the wiring line 3*a* including the insulating cover portion 3*d*.

In the second lead-out portion 15, there is formed a third storage compartment 32 (see FIGS. 5B and 6B) having an opening 32*a* at the side of the wiring substrate 2. The third storage compartment 32 stores portions of the wiring line 3*b* and the electric wire 7. The third storage compartment 32 is isolated from the first storage compartment 13 by a second partition wall portion 21. A third insertion hole 21*b*, through which the wiring line 3*b* is inserted, is formed in the second partition wall portion 21. In addition, a fourth insertion hole 21*c*, through which the electric wire 7 is inserted, is formed in the second partition wall portion 21. In this regard, the third storage compartment 32 communicates with the first storage compartment 13 through the third insertion hole 21*b* and the fourth insertion hole 21*c* formed in the second partition wall portion 21.

The bottom portion 32*d* of the third storage compartment 32 makes up a second flat portion 15*e* formed such that the distance between the first housing member 5 and the second housing member 6 remains constant away from the slant portion 13*d* of the first housing member 5. In the present embodiment, the distance between the second flat portion 15*e* of the third storage compartment 32 and the second housing member 6 is set a little larger than the outer diameter of the wiring line 3*b* including the insulating cover portion 3*d*.

In the present embodiment, the first lead-out portion 14 and the second lead-out portion 15 are arranged at the opposite sides from each other with respect to the centerline extending along the specified direction when the housing 4 is seen in a plan view. More specifically, the first lead-out portion 14 is arranged in one end portion of the housing 4 to lie at one side along the direction orthogonal to both the thickness direction and the lead-out direction of the wiring line 3*a* (at the right lower side in FIG. 2). The second lead-out portion 15 is arranged in the other end portion of the housing 4 to lie at the other side along the orthogonal direction (at the left upper side in FIG. 2). In this regard, the width of the first lead-out portion 14 and the second lead-out portion 15 in the orthogonal direction is set smaller than the width of the housing 4 in the orthogonal direction.

A first and a second lead-out hole 14*b* and 14*c* for respectively leading out the wiring line 3*a* and the electric wire 7 therethrough are formed in one end portion of the first lead-out portion 14 (in the left end portion in FIG. 6B) along the specified direction of the housing 4.

Figure 15A:
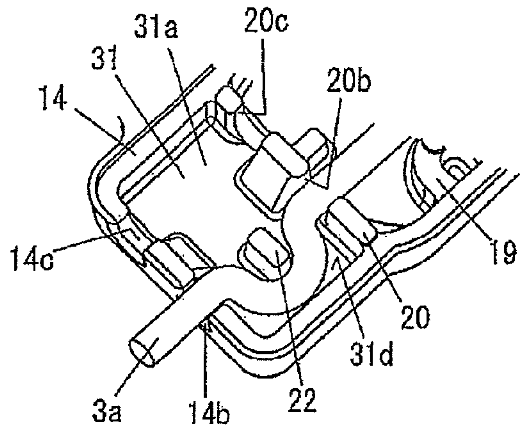
FIG. 15A is an explanatory view showing the first housing member of the LED unit in which a wiring line is attached in place and FIG. 15B is an explanatory view showing the first housing member of the LED unit in which an electric wire is attached in place.
Figure 15B:
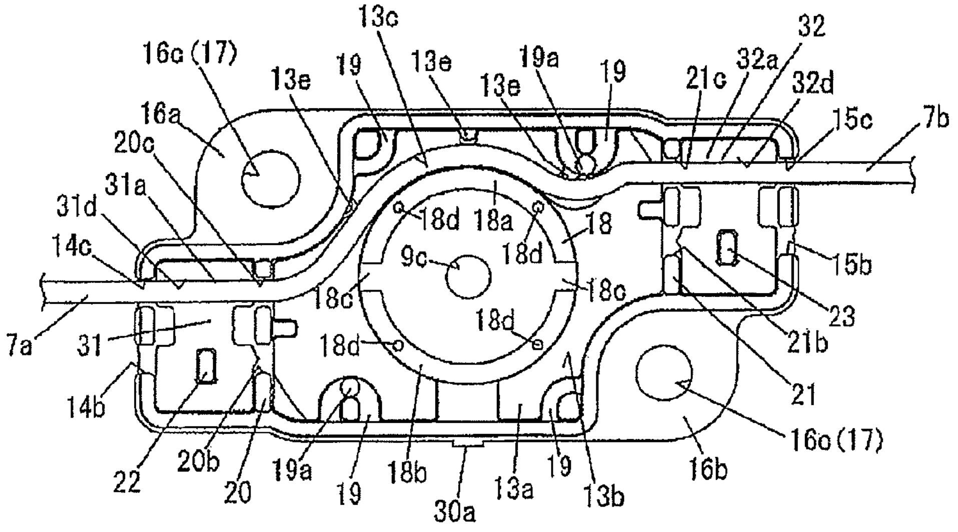

On the area of the bottom portion 31*d* of the second storage compartment 31 opposing the wiring substrate 2, there is formed a second rib 22 for gripping a portion of the wiring line 3*a* led out from the first lead-out hole 14*b* through the first insertion hole 20*b*, in cooperation with the inner wall of the second storage compartment 31 of the first lead-out portion 14 (see FIG. 15A). Briefly, in the present embodiment, the second rib 22 makes up a first tension reducer for gripping a portion of the wiring line 3*a* in cooperation with the inner wall of the first lead-out portion 14. In the present embodiment, therefore, it is not necessary to employ an additional component for reducing the tension applied to the wiring line 3*a*. This makes it possible to realize a function of reducing the tension applied to the wiring line 3*a* in a cost-effective manner. In the present embodiment, since it becomes possible to reduce the tension applied to the wiring line 3*a*, it is possible to prevent disconnection which may otherwise be caused by the stresses acting on the junction portion between a portion of the exposed conductor 3*c* of the wiring line 3*a* and the terminal portion 2*a* of the wiring substrate 2.

A third and a fourth lead-out hole 15*b* and 15*c* for respectively leading out the wiring line 3*b* and the electric wire 7 therethrough are formed in one end portion of the second lead-out portion 15 (in the right end portion in FIG. 6B) along the specified direction of the housing 4.

On the area of the bottom portion 32*d* of the third storage compartment 32 opposing the wiring substrate 2, there is formed a third rib 23 for gripping a portion of the wiring line 3*b* led out from the third lead-out hole 15*b* through the third insertion hole 21*b*, in cooperation with the inner wall of the third storage compartment 32 of the second lead-out portion 15. Briefly, in the present embodiment, the third rib 23 makes up a second tension reducer for gripping a portion of the wiring line 3*b* in cooperation with the inner wall of the second lead-out portion 15. In the present embodiment, therefore, it is not necessary to employ an additional component for reducing the tension applied to the wiring line 3*b*. This makes it possible to realize a function of reducing the tension applied to the wiring line 3*b* in a cost-effective manner. In the present embodiment, since it becomes possible to reduce the tension applied to the wiring line 3*b*, it is possible to prevent disconnection which may otherwise be caused by the stresses acting on the junction portion between a portion of the exposed conductor 3*c* of the wiring line 3*b* and the terminal portion 2*b* of the wiring substrate 2.

Figure 16A:
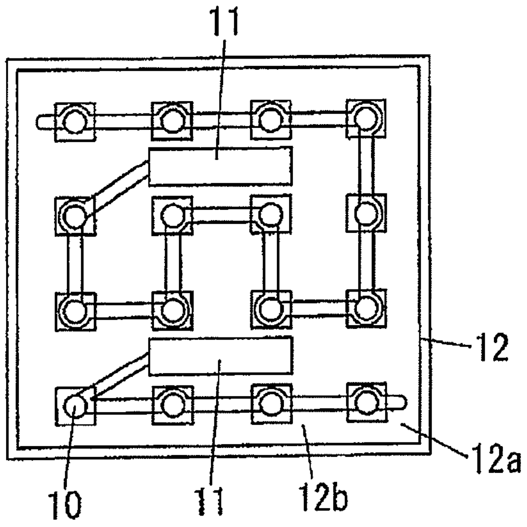
FIG. 16A is a schematic configuration view showing an illumination device according to another embodiment of the present invention and FIG. 16B is an explanatory view explaining the irradiation range of the light emitted from the LED unit.
Figure 16B:
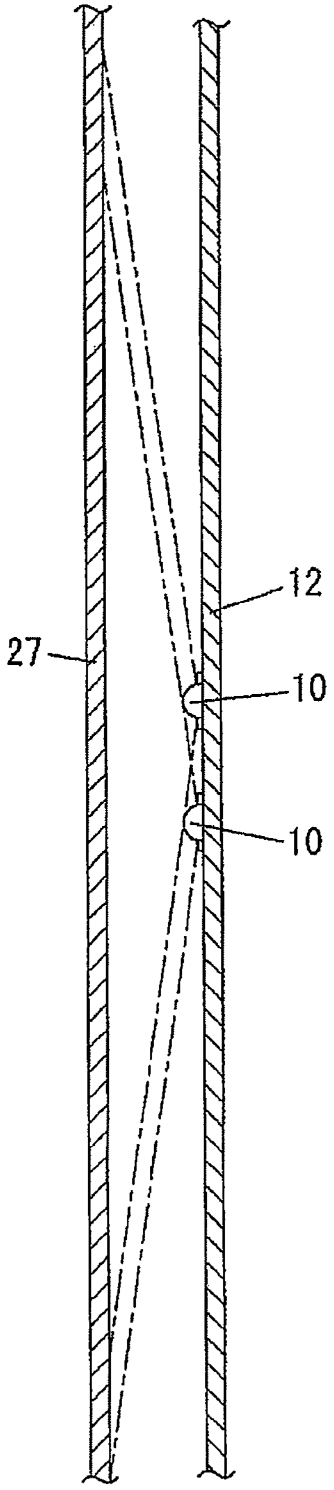
Figure 17:
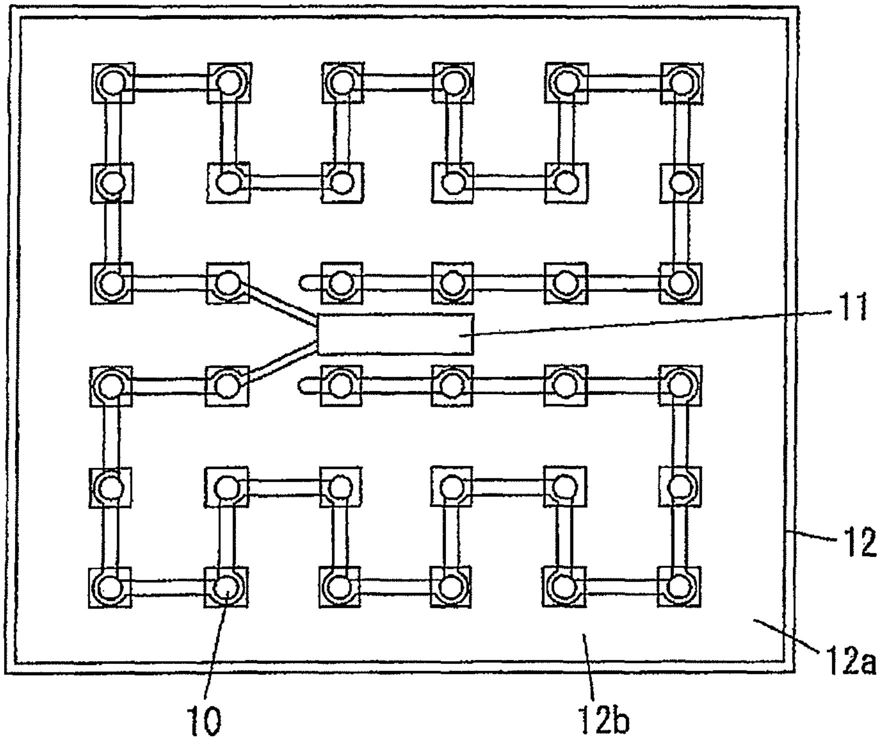
FIG. 17 is a schematic configuration view showing another configuration example of the illumination device.

The first housing member 5 includes a first attachment portion 16*a* and a second attachment portion 16*b* which are formed in one end portion and the other end portion of the housing 4 along the specified direction and used to attach the housing 4 to a device body 12 (see FIGS. 16A to 17). The first attachment portion 16*a* and the second attachment portion 16*b* are respectively arranged at the opposite sides from the first lead-out portion 14 and the second lead-out portion 15 with respect to the centerline of the housing 4. In the present embodiment, the first lead-out portion 14 and the first attachment portion 16*a* are formed to fall within the width of the housing 4. Likewise, the second lead-out portion 15 and the second attachment portion 16*b* are formed to fall within the width of the housing 4.

Each of the attachment portions 16*a* and 16*b* has a first insertion hole 16*c* through which an attachment screw (not shown) for attaching the housing 4 to the device body 12 is inserted from one surface side (the upper surface side in FIG. 2) of each of the attachment portions 16*a* and 16*b*.

In the LED unit 10 of the present embodiment, the first lead-out portion 14 and the second lead-out portion 15 are respectively arranged at the opposite sides from each other with respect to the centerline extending in the specified direction when the housing 4 is seen in a plan view. The first attachment portion 16*a* and the second attachment portion 16*b* are respectively arranged at the opposite sides from the first lead-out portion 14 and the second lead-out portion 15 with respect to the centerline of the housing 4. It is therefore possible to reduce the width of the housing 4 in the orthogonal direction and to reduce the size of the LED unit 10.

The second housing member 6 is formed into a plate-like shape. On the surface of the second housing member 6 facing the wiring substrate 2 (on the upper surface of the second housing member 6 in FIG. 1A), there is formed a protrusion wall 24 in a corresponding relationship with the outer peripheral edges of the first storage compartment 13, the second storage compartment 31 and the third storage compartment 32 of the first housing member 5 (the portion indicated by a single-dot chain line in FIG. 14A).

On the surface of the protrusion wall 24 on the side of the wiring substrate 2, a first lead-out groove 24*b* for leading out the wiring line 3*a* therethrough is formed in a position corresponding to the first lead-out hole 14*b* of the first lead-out portion 14. Moreover, on the surface of the protrusion wall 24 facing the wiring substrate 2, a second lead-out groove 24*c* for leading out the electric wire 7 therethrough is formed in a position corresponding to the second lead-out hole 14*c* of the first lead-out portion 14. In addition, on the surface of the protrusion wall 24 facing the wiring substrate 2, a third lead-out groove 24*a* for leading out the wiring line 3*b* therethrough is formed in a position corresponding to the third lead-out hole 15*b* of the second lead-out portion 15. Furthermore, on the surface of the protrusion wall 24 facing the wiring substrate 2, a fourth lead-out groove 24*d* for leading out the electric wire 7 therethrough is formed in a position corresponding to the fourth lead-out hole 15*c* of the second lead-out portion 15. In the present embodiment, the surface of the first housing member 5 facing the wiring substrate 2 is brought into contact with the tip end surface of the protrusion wall 24 of the second housing member 6. The contact portions are welded ultrasonic welding), thereby combining the first housing member 5 and the second housing member 6 together.

In the areas of the second housing member 6 corresponding to the first lead-out portion 14 and the second lead-out portion 15 of the first housing member 5, there are formed through-holes 6*a* through which a sealing material is filled into the first lead-out portion 14 and the second lead-out portion 15. The sealing material is made of a one-component sealing material curable at the normal temperature (e.g., a silicon resin). In the LED unit 10 of the present embodiment, the sealing material is filled into the first lead-out portion 14 and the second lead-out portion 15 of the housing 4. In the present embodiment, it is therefore possible to prevent water or the like from infiltrating into the housing 4 through the lead-out holes 14*b*, 14*c*, 15*b*, 15*c* and the lead-out grooves 24*a* to 24*d*. The sealing material is not shown in FIGS. 1A and 1B.

In the areas of the second housing member 6 opposing the first lead-out portion 14 and the second lead-out portion 15 of the first housing member 5, there are also formed vent holes 6*b* through which the air existing within the first lead-out portion 14 and the second lead-out portion 15 are discharged to the outside when the sealing material is filled into the first lead-out portion 14 and the second lead-out portion 15. The vent holes 6*b* are formed so that the sealing material filled into the first lead-out portion 14 and the second lead-out portion 15 can flow along the route as indicated by arrows in FIG. 14B.

On the surface of the second housing member 6 facing the wiring substrate 2, fourth ribs 25 capable of making contact with the wiring lines 3*a* and 3*b* and the electric wire 7 are formed in the positions corresponding to the respective insertion holes 20*b*, 20*c*, 21*b* and 21*c* of the first housing member 5. In the present embodiment, it is therefore possible to prevent the sealing material filled via the through-holes 6*a* of the second housing member 6 from infiltrating into the first storage compartment 13 through the respective insertion holes 20*b*, 20*c*, 21*b* and 21*c*. In the present embodiment, the respective insertion holes 20*b*, 20*c*, 21*b* and 21*c* of the first housing member 5 and the respective fourth ribs 25 of the second housing member 6 serve to prevent the first housing member 5 and the second housing member 6 from being combined in the reverse direction. On one side surface of the first housing member 5 in the orthogonal direction (on the right lower side of the first housing member 5 in FIG. 2), a first protrusion 30*a* as a first mark for preventing the first housing member 5 and the second housing member 6 from being combined in the reverse direction is formed to protrude outward. On one side surface of the second housing member 6 in the orthogonal direction (on the right lower side of the first housing member 5 in FIG. 2), a second protrusion 30*b* as a second mark for preventing the first housing member 5 and the second housing member 6 from being combined in the reverse direction is formed to protrude outward in the position corresponding to the first protrusion 30*a* of the first housing member 5.

In the second housing member 6, second insertion holes 6*c* through which the attachment screws are inserted from the side of the first housing member 5 are formed in the positions corresponding to the respective first insertion holes 16*c* of the first attachment portion 16*a* and the second attachment portion 16*b* of the first housing member 5. In the following description, for the sake of convenience, the first insertion holes 16*c* and the second insertion holes 6*c* will sometimes be collectively referred to as "attachment screw insertion holes 17".

The LED unit 10 of the present embodiment includes spacers 26 interposed between the first insertion holes 16*c* of the first housing member 5 and the second insertion holes 6*c* of the second housing member 6. The spacers 26 are not shown in FIGS. 3A and 3B.

The spacers 26 are made of, e.g., stainless steel. Each of the spacers 26 includes a cylindrical body portion 26*a* and a plurality of leg pieces 26*b* extending outward from the outer circumferential surface of the body portion 26*a*. The outer diameter of the body portion 26*a* is set a little smaller than the inner diameter of each of the attachment screw insertion holes 17 of the housing 4. The spacers 26 serve to restrain the attachment screws from applying stresses on the housing 4 when the LED unit 10 is attached to the device body 12.

Figure 18:
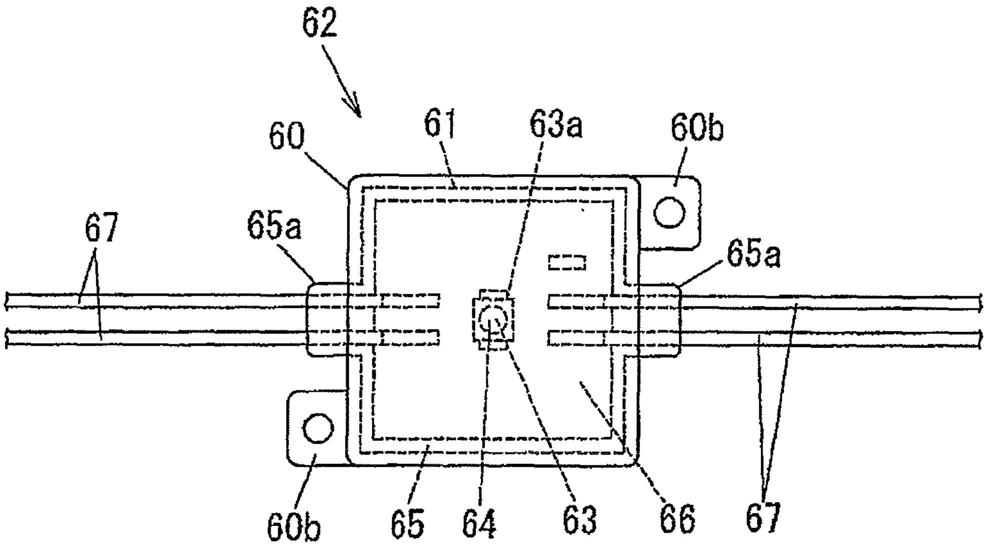
FIG. 18 (PRIOR ART)
FIG. 18 is a plan view showing a conventional light emitting unit.
Figure 19:
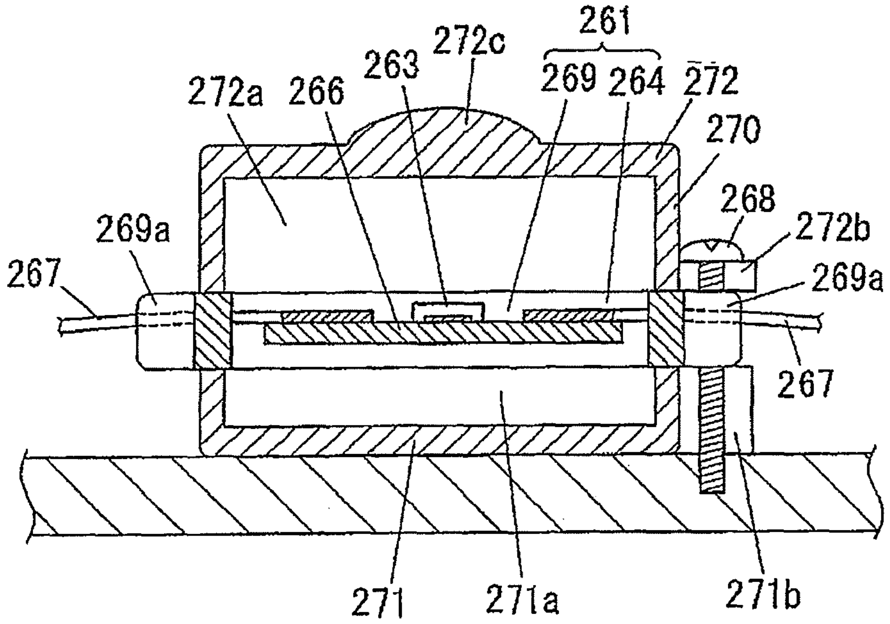
FIG. 19 (PRIOR ART)
FIG. 19 is a section view showing another conventional light emitting unit.

In the LED unit 10 of the present embodiment, the first lead-out portion 14 and the second lead-out portion 15 are arranged at the opposite sides from each other with respect to the centerline extending in the specified direction when the housing 4 is seen in a plan view. The first attachment portion 16*a* and the second attachment portion 16*b* are respectively arranged at the opposite sides from the first lead-out portion 14 and the second lead-out portion 15 with respect to the centerline of the housing 4. Therefore, as compared with the light emitting unit 62 of the configuration shown in FIG. 18, it is possible to reduce the size of the LED unit 10. In the present embodiment, since the first lead-out portion 14 and the second lead-out portion 15 are arranged at the opposite sides from each other with respect to the centerline of the housing 4 and the first attachment portion 16*a* and the second attachment portion 16*b* are arranged at the opposite sides from the first lead-out portion 14 and the second lead-out portion 15 with respect to the centerline of the housing 4, it is possible to eliminate any portion protruding in the orthogonal direction of the housing 4 and to reduce the width of the LED unit 10 in the orthogonal direction.

In the present embodiment, the first housing member 5 includes the slant portion 13*d* formed such that the distance between the opposite surface of the first housing member 5 from the second housing member 6 and the second housing member 6 grows smaller toward the lens portion 9. A portion of the conductor 3*c* of each of the wiring lines 3*a* and 3*b* is arranged between the slant portion 13*d* of the first housing member 5 and the second housing member 6 and is electrically connected to the wiring substrate 2 by a solder. It is therefore possible to increase the area of the light projecting surface (lens surface) of the lens portion 9 and to increase the light utilization efficiency.

In the LED unit 10 of the present embodiment, the wiring line 3*a* is electrically connected to the anode electrode of the LED 1 and the wiring line 3*b* is electrically connected to the cathode electrode of the LED 1. The electric wire 7 is electrically insulated from the wiring lines 3*a* and 3*b* and the wiring substrate 2 within the housing 4 and is led out from the housing 4. Therefore, as compared with the light emitting unit 62 of the configuration shown in FIG. 18, it is possible to reduce a power loss in the LED unit 10 caused by the wiring substrate 2.

Next, an illumination device according to another embodiment of the present invention will be described with reference to FIGS. 16A to 17.

The illumination device of the present embodiment includes the LED unit 10 described above, a power supply unit 11 for supplying electric power to the LED unit 10 and a device body 12 for holding the LED unit 10 and the power supply unit 11. In the present embodiment, the illumination device includes a plurality of LED units 10. The illumination device of the configuration shown in FIG. 16A includes sixteen LED units 10. The illumination device of the configuration shown in FIG. 17 includes thirty six LED units 10. In the illumination devices shown in FIGS. 16A to 17, the LED units 10 are serially connected to each other. The power supply unit 11 supplies electric power to the LED units 10. More specifically, in the present embodiment, the wiring line 3*a* of each LED unit 10 is electrically connected to the power supply unit 11 or the wiring line 3*b* of another LED unit 10. The wiring line 3*b* of each LED unit 10 is electrically connected to the wiring line 3*a* of another LED unit 10 or the electric wire 7 thereof. One end of the electric wire 7 of each LED unit 10 is electrically connected to the power supply unit 11 or the other end of the electric wire 7 of another LED unit 10. The other end of the electric wire 7 of each LED unit 10 is electrically connected to the one end of the electric wire 7 of another LED unit 10 or the wiring line 3*b* of another LED unit 10. While the electric connection of the LED units 10 is serial in the present embodiment, the present invention is not limited thereto. For example, the LED units 10 may be parallel-connected to one another. It may also be possible to use the serial connection and the parallel connection in combination.

The device body 12 is formed into a rectangular box shape having an opening 12*b* at one surface side thereof.

In the bottom portion 12*a* of the device body 12, attachment thread holes (not shown) for the thread coupling with the attachment screws are formed at multiple points in the positions corresponding to the attachment screw insertion holes 17 of the housings 4 of the LED units 10. In the illumination device of the present embodiment, the LED units 10 are attached to the device body 12 by inserting the attachment screws through the attachment screw insertion holes 17 from the one surface side of the attachment portions 16*a* and 16*b* and then threadedly coupling the attachment screws to the attachment thread holes of the device body 12.

The illumination device includes a rectangular plate-like front panel 27 having, e.g., arbitrary letters or specified figures formed on one surface thereof (on the left surface in FIG. 16B). In other words, the illumination device of the present embodiment is used as a signboard. However, the use of the present illumination device is not limited to the signboard.

The device body 12 is configured so that the front panel 27 can be attached thereto at the side of the opening 12*b*. In the present embodiment, the light emitted from the LED units 10 attached to the device body 12 is irradiated on the other surface of the front panel 27 (see FIG. 16B). In the example shown in FIG. 16B, the diffusion angle of the light emitted from the LED units 10 is set equal to 164 degrees.

With the present embodiments, it is therefore possible to provide an illumination device provided with the LED unit 10 capable of enjoying size reduction.

Further, it is possible to provide an illumination device provided with the LED unit 10 capable of increasing the light utilization efficiency.

In addition, it is possible to provide an illumination device provided with the LED unit 10 capable of reducing a power loss.

While the invention has been shown and described with respect to the embodiments, it will be understood by those skilled in the art that various changes and modification may be made without departing from the scope of the invention as defined in the following claims.

What is claimed is:

1. An LED unit, comprising:

a wiring substrate mounted with an LED;

a lens portion having a circular shape in a plan view of the LED unit for controlling distribution of light emitted from the LED;

a housing, having an elongated shape in the plan view, which is provided with the lens portion and is arranged to accommodate the wiring substrate; and a pair of wiring lines electrically connected to the wiring substrate and extending out from the housing, wherein the lens portion has a convex shaped surface and is arranged in a central region of a surface of the housing, wherein a first lead-out portion, having a first lead-out hole for leading out one of the wiring lines in a longitudinal direction of the housing in the plan view, is provided at one end portion of the housing along the longitudinal direction, and a second lead-out portion, having a second lead-out hole for leading out the other wiring line in the longitudinal direction, is provided at the other end portion of the housing along the longitudinal direction, wherein the first lead-out portion and the second lead-out portion are arranged at the opposite sides from each other with respect to a centerline of the housing extending along the longitudinal direction in the plan view, and wherein each of the first lead-out hole and the second lead-out hole is provided in a surface extending along a short side of the housing in the plan view and, in the plan view, the distance from an outer periphery of the lens portion to the short side of the housing is greater than the distance from the outer periphery of the lens portion to a long side of the housing.

2. The unit of claim 1, wherein the housing includes a first housing member arranged at an LED mounting side of the wiring substrate and provided with the lens portion and a second housing member arranged at the opposite side of the wiring substrate from the LED mounting side, each of the wiring lines being a cable including a conductor electrically connectable to the wiring substrate and an insulating cover portion covering the conductor, a portion of the conductor being exposed within the housing, the first housing member including a slant portion formed such that the distance between the first housing member and the second housing member becomes smaller toward the lens portion, the portion of the conductor of each of the wiring lines being arranged between the slant portion of the first housing member and the second housing member and being electrically connected to the wiring substrate by a solder.

3. The unit of claim 2, wherein the first housing member and the second housing member are made of a resin material, the housing being formed by welding the first housing member and the second housing member together, a sealing material being filled into the first lead-out portion and the second lead-out portion.

4. The unit of claim 1, wherein the first lead-out portion includes a first tension reducer for gripping a portion of one of the wiring lines in cooperation with an inner wall of the first lead-out portion and wherein the second lead-out portion includes a second tension reducer for gripping a portion of the other wiring line in cooperation with an inner wall of the second lead-out portion.

5. The unit of claim 1, further comprising an electric wire electrically insulated from the wiring lines and the wiring substrate within the housing and led out through the first lead-out portion and the second lead-out portion.

6. An illumination device, comprising:
the LED unit of claim 1;
a power supply for supplying electric power to the LED unit; and
a device body which holds the LED unit and the power supply.

7. An LED unit, comprising:
a wiring substrate mounted with an LED;
a housing which accommodates the wiring substrate, the housing including a light projecting portion for projecting light emitted from the LED; and
at least one pair of wiring lines electrically connected to the wiring substrate and extending out from the housing,
wherein the housing includes a first housing member arranged at an LED mounting side of the wiring substrate and provided with the light projecting portion and a second housing member arranged at the opposite side of the wiring substrate from the LED mounting side,
wherein the light projecting portion is a lens portion for controlling distribution of the light emitted from the LED, the light projecting portion having a light projecting surface having a convex shape,
wherein each of the wiring lines is a cable including a conductor and an insulating cover portion covering the conductor, a portion of the conductor being exposed within the housing,
wherein the first housing member includes a slant portion formed such that the distance between the opposite surface of the first housing member from the second housing member and the second housing member grows smaller toward the lens portion, and
wherein the portion of the conductor of each of the wiring lines is arranged between the slant portion of the first housing member and the second housing member and is electrically connected to the wiring substrate by solder.

8. The unit of claim 7, wherein, when an optical axis of the LED is aligned with an optical axis of the lens portion, an inclination angle of a slant surface of the slant portion opposite to the second housing member with respect to the optical axis of the lens portion is set equal to or larger than a maximum projecting angle at which the light projected from the light projecting surface of the lens portion makes a greatest angle with respect to the optical axis of the lens portion.

9. An illumination device, comprising:
the LED unit of claim 7;
a power supply for supplying electric power to the LED unit; and
a device body which holds the LED unit and the power supply.

10. An LED unit, comprising:
a wiring substrate mounted with an LED;
a housing which accommodates the wiring substrate, the housing including a light projecting portion for projecting light emitted from the LED;
a pair of wiring lines electrically connected to the wiring substrate and extending out from the housing, the wiring lines being electrically connected to an anode electrode and a cathode electrode of the LED, respectively; and
an electric wire electrically insulated from the wiring lines and the wiring substrate within the housing and extending out from the housing,
wherein the electric wire is provided independently of the wiring substrate.

11. The unit of claim 10, wherein a reception groove for receiving a portion of the electric wire is provided on an inner surface of the housing in an area outward of the light projecting portion.

12. The unit of claim 10, wherein a tension reducer for gripping a portion of the electric wire is provided within the housing.

13. An illumination device, comprising:
the LED unit of claim 10;
a power supply for supplying electric power to the LED unit; and
a device body which holds the LED unit and the power supply.

* * * * *